(12) United States Patent
Kim et al.

(10) Patent No.: US 8,692,376 B2
(45) Date of Patent: Apr. 8, 2014

(54) SEMICONDUCTOR DEVICE AND METHOD OF MANUFACTURING THE SAME

(75) Inventors: Jung Geun Kim, Seoul (KR); Whee Won Cho, Chungcheongbuk-do (KR); Eun Soo Kim, Gyeonggi-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 0 days.

(21) Appl. No.: 13/463,071

(22) Filed: May 3, 2012

(65) Prior Publication Data

US 2012/0280397 A1 Nov. 8, 2012

(30) Foreign Application Priority Data

May 6, 2011 (KR) ........................ 10-2011-0042856

(51) Int. Cl.
*H01L 23/48* (2006.01)

(52) U.S. Cl.
USPC ...................... 257/770; 257/741; 257/E23.01

(58) Field of Classification Search
USPC ............. 257/779, 741, 768, E23.01, E21.586
See application file for complete search history.

(56) References Cited

U.S. PATENT DOCUMENTS

| 6,426,289 B1 | 7/2002 | Farrar |
| 2006/0084256 A1* | 4/2006 | Cabral et al. .................. 438/597 |
| 2010/0200993 A1 | 8/2010 | Cui et al. |

FOREIGN PATENT DOCUMENTS

| KR | 1019970005000 | 4/1997 |
| KR | 100202667 | 6/1999 |
| KR | 100215848 | 8/1999 |

OTHER PUBLICATIONS

Notice of Preliminary Rejection issued by the Korean Intellectual Property Office on Feb. 21, 2013.
Office Action issued from the Korean Intellectual Property Office on Aug. 7, 2012.

* cited by examiner

*Primary Examiner* — Zandra Smith
*Assistant Examiner* — Paul Patton
(74) *Attorney, Agent, or Firm* — IP & T Group LLP

(57) ABSTRACT

A method of manufacturing a semiconductor device includes forming an interlayer dielectric layer, forming trenches by etching the interlayer dielectric layer, forming a copper (Cu) layer to fill the trenches, and implanting at least one of an inert element, a nonmetallic element, and a metallic element onto a surface of the Cu layer.

7 Claims, 2 Drawing Sheets

SEMICONDUCTOR DEVICE AND METHOD OF MANUFACTURING THE SAME

CROSS-REFERENCE TO RELATED APPLICATION

Priority to Korean patent application number 10-2011-0042856 filed on May 6, 2011, the entire disclosure of which is incorporated by reference herein, is claimed.

BACKGROUND

Exemplary embodiments relate to a semiconductor device and a method of manufacturing the same and, more particularly, to a semiconductor device including copper (Cu) wiring and a method of manufacturing the same.

A semiconductor device includes a metal wiring system for electrically coupling individual semiconductor elements. The material of the metal wiring is to be determined by taking the electrical properties and the manufacturing costs of the semiconductor device into consideration because the signal transfer speed quite differs depending on what material is used to form the metal wiring.

In a conventional art, the metal wiring is chiefly made of aluminum (Al). However, a technique for forming the metal wiring using copper (Cu) instead of aluminum (Al) is being developed since copper (Cu) has lower resistivity than aluminum (Al) and has higher melting point than aluminum (Al). If Cu wiring is used, reliability of the semiconductor device may be increased and the signal transfer speed thereof may be increased because of low resistivity.

If the Cu wiring is used in the semiconductor device, however, the Cu wiring may be shrunk or Cu atoms of the Cu wiring may be diffused in an annealing process performed after the Cu wiring is formed. Accordingly, the Cu wiring may be disconnected or bridged. For example, a short circuit may be generated in a contact area because of tensile stress caused by the shrinkage of the Cu wiring.

Specifically, the wiring may be damaged by electron-migration (EM) generated in stress conditions of current. Furthermore, the wiring may be damaged by stress-migration generated in stress-induced conditions.

If the Cu wiring is used in the semiconductor device as described above, the reliability of the semiconductor device may be degraded because the electron-migration (EM) or the stress migration is generated.

BRIEF SUMMARY

Exemplary embodiments relate to a semiconductor device having increased reliability by reducing the atoms diffusion and mobility of Cu wiring and a method of manufacturing the same.

A semiconductor device according to an aspect of the present disclosure includes semiconductor elements and a copper (Cu) wiring, comprising at least one of an inert element, a nonmetallic element, and a metallic element, configured to couple the semiconductor elements.

A method of manufacturing a semiconductor device according to another aspect of the present disclosure includes forming an interlayer dielectric layer, forming trenches by etching the interlayer dielectric layer, forming a copper (Cu) layer to fill the trenches, and injecting at least one of an inert element, a nonmetallic element, and a metallic element onto a surface of the Cu layer.

DESCRIPTION OF EMBODIMENTS

Hereinafter, some exemplary embodiments of the present disclosure will be described in detail with reference to the accompanying drawings. The figures are provided to enable those of ordinary skill in the art to make and use the embodiments of the disclosure.

A semiconductor device according to an embodiment of this disclosure includes semiconductor elements and a copper (Cu) wiring configured to couple the semiconductor elements. Here, Cu wiring includes at least one of an inert element, a nonmetallic element, and a metallic element. The atoms of the at least one of the inert element, the nonmetallic element, and the metallic element may be injected into the Cu wiring using an ion implantation process.

If the ions/atoms are injected into the Cu wiring as describe above, the number of atoms included in the same volume is increased. In other words, since the total number of atoms within the Cu wiring is increased, the Cu wiring may be prevented from being shrunk or disconnected owing to a subsequent annealing process.

Furthermore, since the diffusion of the Cu atoms is substitution-type diffusion through voids, the voids around the Cu atoms are substituted with the Cu atoms and thus the Cu atoms are diffused. Accordingly, the number of voids around the Cu atoms can be reduced by injecting ions into the Cu wiring, and thus the diffusion of the Cu atoms may be reduced.

Accordingly, according to this disclosure, the short circuit and bridge of the Cu wiring may be prevented by preventing the Cu wiring from being shrunk or the Cu atoms from being diffused in a subsequent annealing process.

Methods of forming the Cu wiring according to embodiments of this disclosure are described below.

Figure 1A:
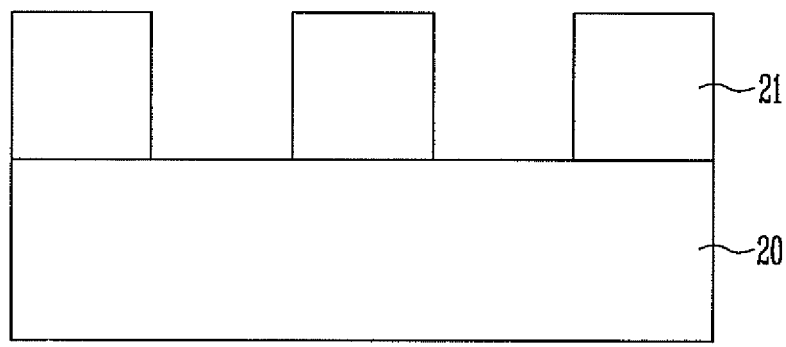
FIGS. 1A to 1C are cross-sectional view illustrating a method of forming Cu wiring according to a first embodiment of this disclosure.
Figure 1B:
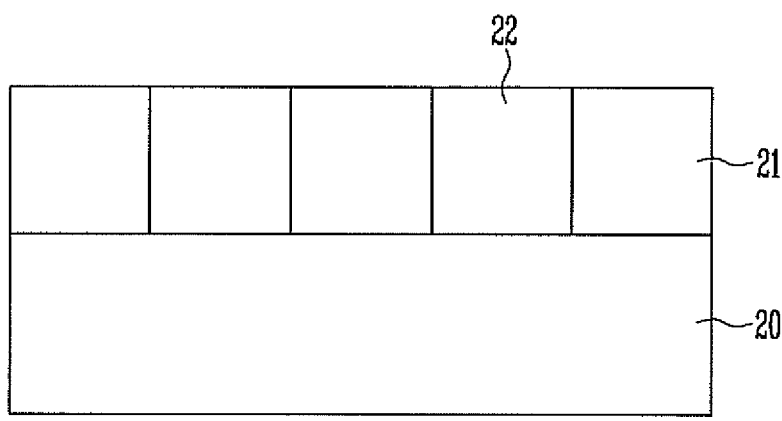
Figure 1C:
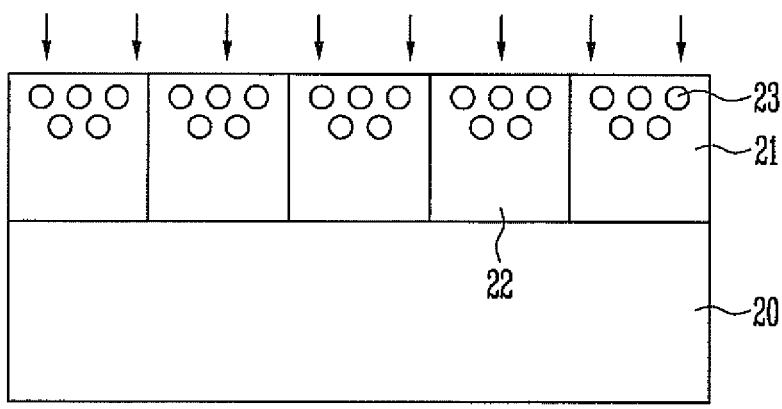

FIGS. 1A to 1C are cross-sectional view illustrating a method of forming Cu wiring according to a first embodiment of this disclosure. In the first embodiment, it is described as an example that the Cu wiring is formed by injecting an inert element or a nonmetallic element.

As shown in FIG. 1A, an interlayer dielectric layer 21 is formed over a substrate 20 in which underlying structures (not shown) are formed. The interlayer dielectric layer 21 is etched to form trenches for forming metal wiring. The interlayer dielectric layer 21 may be an oxide layer.

As shown in FIG. 1B, a Cu layer 22 is formed to be buried in the trenches. For example, Cu wiring buried in the trenches may be formed by forming the Cu layers 22 on the entire of the resultant structure in which the trenches are formed and then performing a polishing process until a surface of the interlayer dielectric layer 21 is exposed.

As shown in FIG. 1C, an inert element or a nonmetallic element 23 is injected onto a surface of the Cu layers 22 using an ion implantation process. In the ion implantation process, the inert element or the nonmetallic element 23 may be injected onto not only the surface of the Cu layers 22, but also the surface of the interlayer dielectric layer 21.

The inert element may include at least one of helium (He), neon (Ne), argon (Ar), krypton (Kr), xenon (Xe), and radon (Rn). The nonmetallic element may include at least one of hydrogen (H), carbon (C), nitrogen (N), oxygen (O), phosphorous (P), sulfur (S), and selenium (Se). Accordingly, the Cu wiring into which the inert element or the nonmetallic element 23 has been injected is formed.

Furthermore, the inert element or the nonmetallic element 23 injected into the Cu layers 22 may exist in the form of an atom or in the form of a compound produced by reacting with copper (Cu). For example, the compound may be copper sulfide ($Cu_2S$), copper oxide (CuO), or copper selenide (CuSe or $CuSe_2$).

The ion implantation process may be performed using energy less than 50 KeV. It is preferred that a doping concentration of the inert element or the nonmetallic element 23 range from 1E15 to 5E16 atoms/$cm^2$ and an Rp point of the inert element or the nonmetallic element 23 range from 5 to 50 nm.

In the first embodiment, such an example that the ion implantation process is performed after the polishing process is described. However, the polishing process may be performed after the ion implantation process. If the polishing process is performed after the ion implantation process, it is preferred that the Rp point, the energy, and the doping concentration be controlled so that the inert element or the nonmetallic element 23 remains within the Cu wiring even after the polishing process. For example, it is preferred that the Rp point be adjusted to become 500 nm or higher and the energy and the doping concentration used in the ion implantation process be increased.

In the first embodiment, the inert element or the nonmetallic element 23 remains not only in the Cu wiring, but also in the interlayer dielectric layer 21. However, the inert element or the nonmetallic element 23 does not generate such a bridge because the element has non-conductivity, although they remain in the interlayer dielectric layer 21. And of course a polishing process for removing the inert element or the nonmetallic element 23 injected into the interlayer dielectric layer 21 may be performed as occasion demands.

FIGS. 2A to 2D are cross-sectional view illustrating a method of forming Cu wiring according to a second embodiment of this disclosure. In the second embodiment, it is described as an example that the Cu wiring is formed by injecting a metallic element. The same descriptions as those of the first embodiment are omitted for the purpose of the description.

Figure 2A:
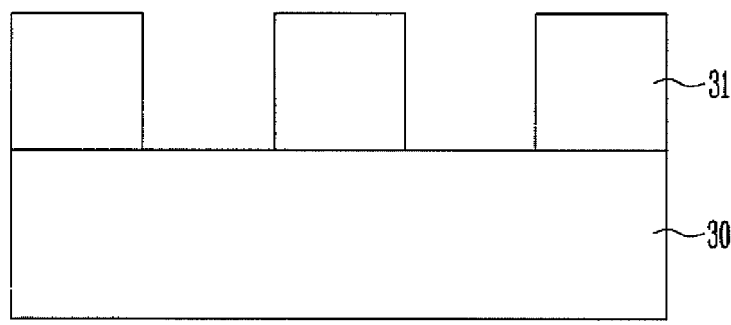
FIGS. 2A to 2D are cross-sectional view illustrating a method of forming Cu wiring according to a second embodiment of this disclosure.

As shown in FIG. 2A, an interlayer dielectric layer 31 is formed over a substrate 30 in which underlying structures (not shown) are formed: The interlayer dielectric layer 31 is etched to form trenches for forming metal wiring.

Figure 2B:
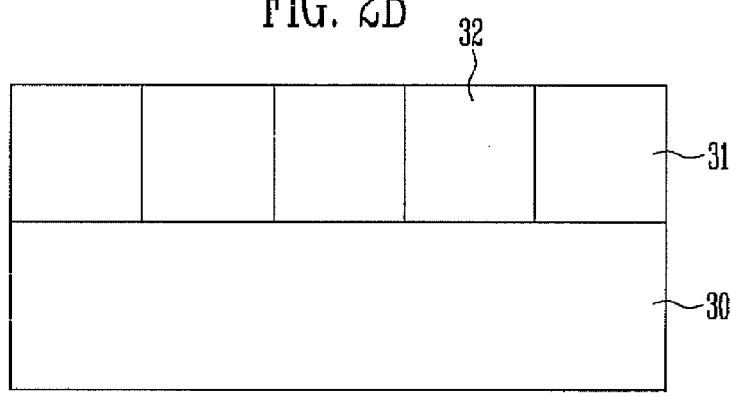

As shown in FIG. 2B, a Cu layer 32 is formed on the entire of the resultant structure in which the trenches are formed. The Cu layers 32 buried in the trenches are formed by performing a primary polishing process until a surface of the interlayer dielectric layer 31 is exposed.

Figure 2C:
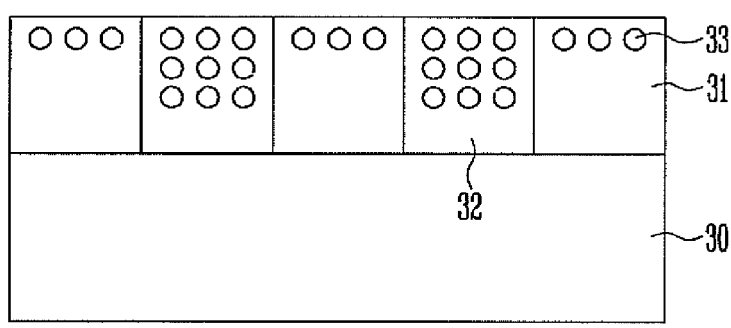

As shown in FIG. 2C, the metallic element 33 is injected onto the surface of the Cu layers 32 using an ion implantation process. In the ion implantation process, the metallic element 33 may be injected onto not only the surface of the Cu layers 32, but also the surface of the interlayer dielectric layer 31.

Here, the metallic element may be a high melting point of metallic element. The high melting point of metallic element is metal having a melting point higher than a melting point (1530° C.) of iron. For example, the high melting point of metallic element may be tungsten (W) (a melting point 3,400° C.), molybdenum (Mo) (a melting point 2,620° C.), or tantalum (Ta) (a melting point 2,850□). Furthermore, the metallic element may be metal having a higher melting point than operation temperatures of processes performed after Cu wiring is formed. For example, the metallic element may be cobalt (Co) (a melting point 1,495° C.). Accordingly, the metallic element 33 used in the ion implantation process may include at least one of tungsten (W), molybdenum (Mo), cobalt (Co), and tantalum (Ta).

The metallic element 33 injected into the Cu layers 32 may exist in the form of an atom or in the form of a compound produced by reacting with copper (Cu). For example, the compound may be copper tungsten (CuW) or copper molybdenum (CuMo).

It is preferred that the ion implantation process be a low energy ion implantation process. For example, energy of 30 KeV may be used. Furthermore, it is preferred that a doping concentration of the metallic element 33 range from 1E15 to 5E16 atoms/$cm^2$ and an Rp point thereof range from 5 to 50 nm. An Rp point of the metallic element 33 injected into the Cu layers 32 may be different from an Rp point of the metallic element injected into the interlayer dielectric layer 31.

Figure 2D:
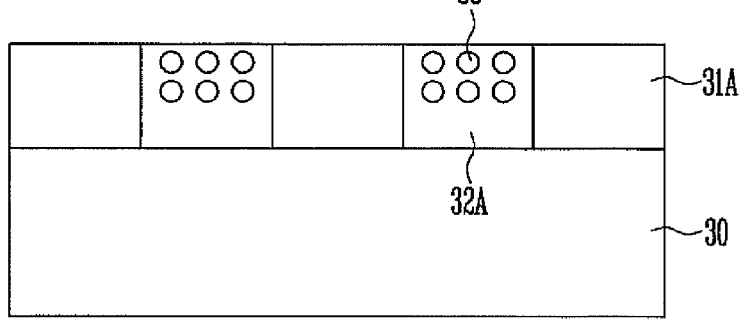

As shown in FIG. 2D, a secondary polishing process is performed until the metallic element 33 injected into the interlayer dielectric layer 31 is removed. In FIG. 2D, the interlayer dielectric layer remaining after the polishing process is performed is assigned reference numeral '31A', and the Cu layers reaming after the polishing process is performed is assigned reference numeral '32A'.

The secondary polishing process is performed in order to prevent a bridge from being generated between the Cu wiring of the metallic element. It is preferred that the polishing process be performed so that the metallic element 33 injected into the Cu wiring remain, but the metallic element 33 injected into the interlayer dielectric layer 31 be removed.

For example, Rp points of the metallic element 33 in the Cu layers 32 and in the interlayer dielectric layer 31 may be calculated by using conditions such as energy and a doping concentration in the ion implantation process. It is preferred that the time taken to perform the polishing process be determined by taking the polishing speed depending on CMP process conditions (pressure, RPM, and the amount of slurry) into consideration. The polishing process may be performed for 10 to 20 seconds by taking removal uniformity into consideration.

Accordingly, the Cu wiring into which the metallic element 33 have been injected is formed.

In the second embodiment, such an example that the primary polishing process, the ion implantation process, and the secondary polishing process are sequentially formed is described. In some embodiments, only the secondary polishing process may be performed without the primary polishing process. In this case, it is preferred that the Rp point be adjusted to become 500 nm or higher and the energy and doping concentration used in ion implantation process be increased so that the metallic element 33 remain in the Cu wiring even after the secondary polishing process.

Meanwhile, the Cu wiring may be formed in the manner obtained by combining the first embodiment and the second embodiment.

For example, after the inert element or the nonmetallic element is injected onto a surface of the Cu layer 22 or 32 through a primary ion implantation process, the metallic element may be secondarily injected onto a surface of the Cu layer 22 or 32 into which the inert element or the nonmetallic element has been injected using a secondary ion implantation process. Next, the Cu wiring is formed by performing a polishing process until the metallic element implanted into the interlayer dielectric layer 21 or 31 is removed.

In this case, the primary ion implantation process may be performed on condition that energy is less than 50 KeV, a doping concentration ranges from 1E15 to 5E16 atoms/cm$^2$, and an Rp point ranges from 5 to 50 nm. The secondary ion implantation process may be performed on condition that energy is less than 30 KeV, a doping concentration ranges from 1E15 to 5E16 atoms/cm$^2$, and an Rp point ranges from 5 to 50 nm.

If the metallic element is injected using the secondary ion implantation process after the inert element or the nonmetallic element is injected using the primary ion implantation process as described above, the leakage current between the Cu wiring may be effectively prevented from being occurred.

For another example, after the metallic element is injected onto a surface of the Cu layer 22 or 32 through a primary ion implantation process, the inert element or the nonmetallic element may be implanted onto a surface of the Cu layer 22 or 32 into which the metallic element has been injected using a secondary ion implantation process. Next, the Cu wiring is formed by performing a polishing process until the metallic element injected into the interlayer dielectric layer 21 or 31 is removed.

According to this disclosure, since at least one of the inert element, the nonmetallic element, and the metallic element is implanted into the Cu wiring using an ion implantation process, the diffusion and mobility of Cu atoms of the Cu wiring may be reduced. Accordingly, the short circuit and bridge of the Cu wiring may be prevented from being occurred and reliability of a semiconductor device may be increased.

What is claimed is:

1. A semiconductor device, comprising:
    semiconductor elements; and
    a copper (Cu) wiring, comprising at least one of an inert element, a nonmetallic element, and a metallic element, configured to couple the semiconductor elements,
    wherein at least one of the inert element, the nonmetallic element, and the metallic element exists in a form of an atom in the copper wiring.

2. The semiconductor device of claim 1, wherein the inert element comprises at least one of helium (He), neon (Ne), argon (Ar), krypton (Kr), xenon (Xe), and radon (Rn).

3. The semiconductor device of claim 1, wherein the nonmetallic element comprises at least one of hydrogen (H), carbon (C), nitrogen (N), oxygen (O), phosphorous (P), sulfur (S), and selenium (Se).

4. The semiconductor device of claim 1, wherein the metallic element has a higher melting point than iron.

5. The semiconductor device of claim 1, wherein the metallic element comprises at least one of tungsten (W), molybdenum (Mo), cobalt (Co), and tantalum (Ta).

6. A semiconductor device, comprising:
    semiconductor elements; and
    a copper (Cu) wiring comprising an inert element or a metallic element in a form of a compound produced by reacting with copper (Cu).

7. The semiconductor device of claim 6, wherein the compound comprises at least one of tungsten copper (CuW) and copper molybdenum (CuMo), which is produced by the metallic element reacting with copper (Cu).

* * * * *